(12) United States Patent
You et al.

(10) Patent No.: US 7,830,180 B2
(45) Date of Patent: Nov. 9, 2010

(54) NOISE PROTECTOR

(75) Inventors: Byoung Sung You, Jecheon-si (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 128 days.

(21) Appl. No.: 12/117,696

(22) Filed: May 8, 2008

(65) Prior Publication Data
US 2009/0160543 A1 Jun. 25, 2009

(30) Foreign Application Priority Data
Dec. 24, 2007  (KR) ...................... 10-2007-0136369

(51) Int. Cl.
*G01R 29/02* (2006.01)
*H03K 9/08* (2006.01)
(52) U.S. Cl. .......................... 327/34; 327/31
(58) Field of Classification Search ...................... 327/34
See application file for complete search history.

(56) References Cited
U.S. PATENT DOCUMENTS
4,525,635 A * 6/1985 Gillberg ...................... 327/34
4,716,318 A * 12/1987 Koike ........................ 327/558
5,019,724 A * 5/1991 McClure ...................... 326/29
5,198,710 A * 3/1993 Houston ...................... 327/552
5,877,651 A * 3/1999 Furutani ...................... 327/538

FOREIGN PATENT DOCUMENTS

| KR | 1997-0013725 | 3/1997 |
|---|---|---|
| KR | 1019990055374 A | 7/1999 |
| KR | 1020050011473 A | 1/2005 |
| KR | 1020070069383 A | 7/2007 |

* cited by examiner

*Primary Examiner*—Lincoln Donovan
*Assistant Examiner*—Ryan C Jager
(74) *Attorney, Agent, or Firm*—Townsend and Townsend and Crew LLP

(57) ABSTRACT

A noise protector includes a first noise control block for NORing an input signal and a first trimmed input signal and providing an output; a second noise control block for NANDing the input signal and a second trimmed input signal and providing an output; and an output signal generation block for outputting an output signal removed of noise in response to the outputs of the first noise control block and the second noise control block.

12 Claims, 8 Drawing Sheets

| S | R | Q | Q# |
|---|---|---|---|
| 1 | 0 | 1 | 0 |
| 1 | 1 | Forbidden | |
| 0 | 1 | 0 | 1 |
| 0 | 0 | Keep the value | |

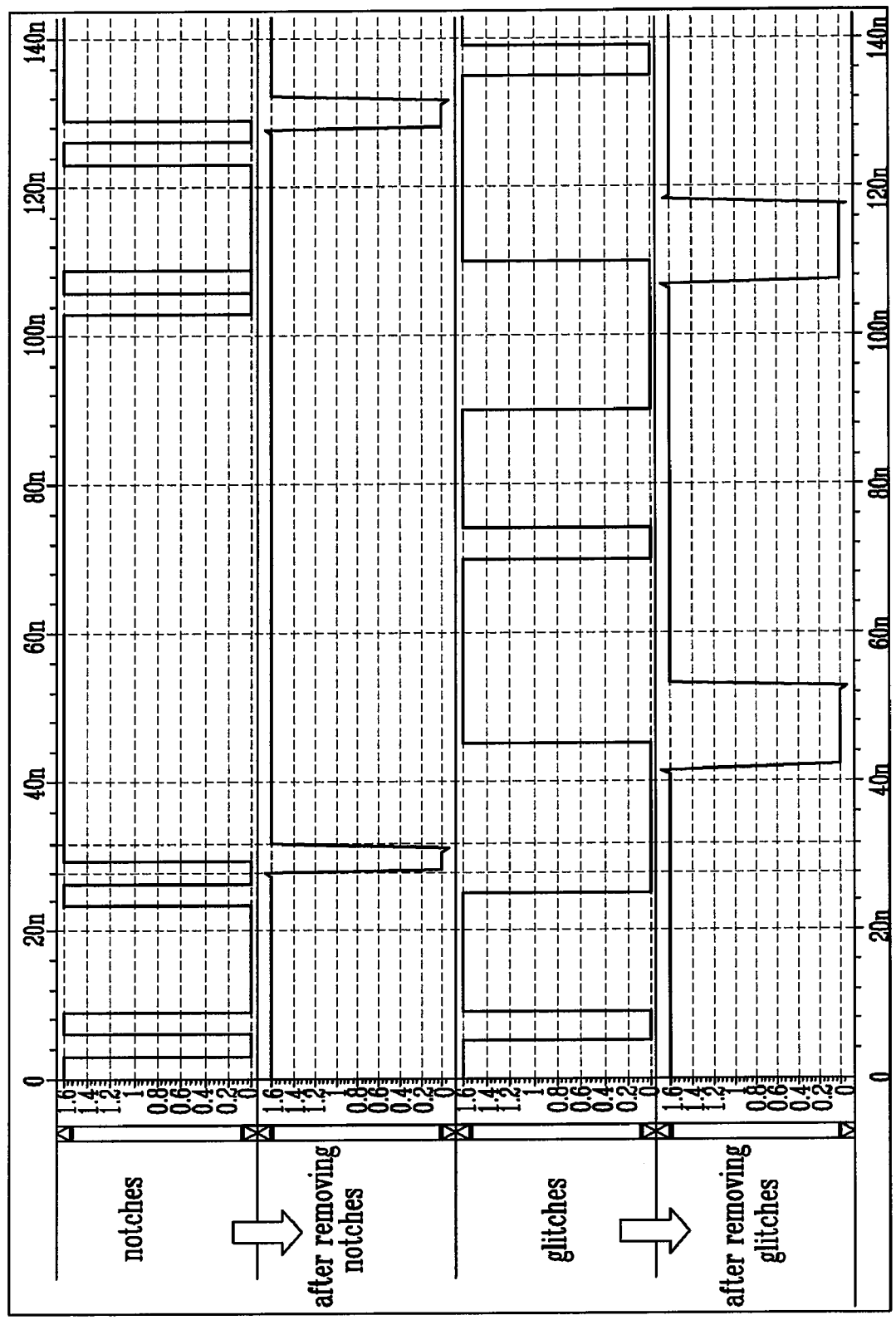

FIG. 9

3V Glitch

| tingl | toutgl | Couner margin | temper | Skew | VDC |
|---|---|---|---|---|---|
| 7.78ns | 3.54ns | 15.8ns | 25 | Typical | 2.2 |
| 5.03ns | 2.29ns | 17.3ns | -40 | Fast | 2.4 |
| 1.12ns | 5.29ns | 14.1ns | 90 | Slow | 2.1 |

3V Notch

| tingl | toutgl | Couner margin | temper | Skew | VDC |
|---|---|---|---|---|---|
| 13.7ns | 3.56ns | 9.83ns | 25 | Typical | 2.2 |
| 11.0ns | 2.29ns | 11.3ns | -40 | Fast | 2.4 |
| 17.3ns | 7.57ns | 10.3ns | 90 | Slow | 2.1 |

3V Glitch protection width

| Bias | Skew | Temper | Glitch width |
|---|---|---|---|
| 2.4V | Fast | -40 | 5ns |
| 2.2V | Typical | 25 | 6ns |
| 2.1V | Slow | 90 | 7ns |

1.8V Glitch

| tingl | toutgl | Couner margin | temper | VDC | Skew |
|---|---|---|---|---|---|
| 9.42ns | 4.26ns | 14.8ns | 25 | 1.8 | Typical |
| 5.98ns | 2.52ns | 16.5ns | -40 | 2.0 | Fast |
| 1.67ns | 7.84ns | 11.2ns | 90 | 1.6 | Slow |

1.8V Notch

| tingl | toutgl | Couner margin | temper | VDC | Skew |
|---|---|---|---|---|---|
| 15.5ns | 7.47ns | 11.9ns | 25 | 1.8 | Typical |
| 11.6ns | 2.52ns | 10.9ns | -40 | 2.0 | Fast |
| 2.49ns | 8.68ns | 3.83ns | 90 | 1.6 | Slow |

1.8V Glitch protection width

| Bias | Skew | Temper | Glitch width |
|---|---|---|---|
| 2.0V | Fast | -40 | 5ns |
| 1.8V | Typical | 25 | 8ns |
| 1.6V | Slow | 90 | 10ns |

NOISE PROTECTOR

CROSS-REFERENCES TO RELATED APPLICATIONS

The present application claims priority to Korean patent application number 10-2007-136369, filed on Dec. 24, 2007, which is incorporated by reference in its entirety.

BACKGROUND OF THE INVENTION

The present invention relates to a noise protector which is used in a semiconductor circuit device.

In the operation of a DRAM, a NAND type non-volatile memory, a NOR type non-volatile memory, and other memory devices, if impedance matching is not accomplished among component elements, reflection waves are generated. As a result, noise such as glitches or notches is generated.

In the event that noise such as glitches or notches is applied to a semiconductor circuit operating at a high frequency, errors can be caused in the operation of the semiconductor circuit. That is to say, errors can be caused in the values of transmitted data due to the presence of the noise, which can lead to the mis-operation of the entire semiconductor circuit.

Accordingly, a noise protector for removing noise is required.

SUMMARY OF THE INVENTION

Embodiments of the present invention are directed to a noise protector which can remove noise such as glitches or notches.

In one aspect, a noise protector comprises a first noise control block for NORing an input signal and a first trimmed input signal and providing an output; a second noise control block for NANDing the input signal and a second trimmed input signal and providing an output; and an output signal generation block for outputting an output signal removed of noise in response to the outputs of the first noise control block and the second noise control block.

In another aspect, a noise protector comprises a first noise control block for outputting information regarding whether both an input signal and a first trimmed input signal have a low level; a second noise control block for outputting information regarding whether both the input signal and a second trimmed input signal have a high level; and an output signal generation block for outputting an output signal removed of noise in response to outputs of the first noise control block and the second noise control block.

BRIEF DESCRIPTION OF THE DRAWINGS

FIG. 8 is a waveform diagram illustrating notch and glitch removing operations under a voltage condition which is different from FIG. 7.

FIG. 9 shows tables illustrating margins under various voltage and temperature conditions in accordance with an embodiment of the present invention.

DESCRIPTION OF SPECIFIC EMBODIMENT

Figure 1:
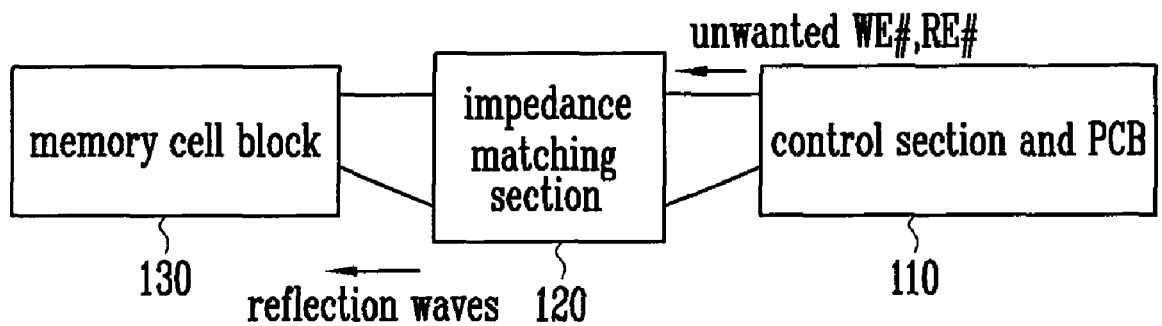
FIG. 1 is a view for explaining the function of an impedance matching section in a conventional semiconductor memory device.

Reference will now be made in detail to a specific embodiment of the invention, an example of which is illustrated in the accompanying drawings. It is to be noted that the present invention must not to be construed as being limited by the present embodiment and can be realized in a variety of ways. The present embodiment is provided to make the disclosure of the present invention complete and to allow the person having ordinary knowledge in the art to better understand the scope of the present invention. The same reference numerals will be used throughout the drawings and the description to refer to the same parts.

FIG. 1 is a view for explaining the function of an impedance matching section in a conventional semiconductor memory device.

An impedance matching section 120 is connected between a control section and PCB 110, and a memory cell block 130.

The impedance matching section 120 functions to reduce reflection caused due to a difference in impedance between the two different connection units.

The reflection may not be completely eliminated even by the impedance matching section 120. For example, when an unwanted write enable signal 'WE#' or an unwanted read enable signal 'RE#' is inputted in a non-volatile memory device, reflection waves may be generated.

If the impedance matching section 120 is not provided, the influence by the reflection waves may be increased.

Figure 2A:
FIGS. 2A and 2B are waveform diagrams illustrating a glitch and a notch to be removed.
Figure 2B:
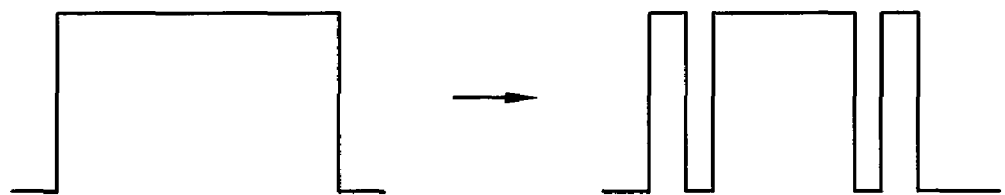

FIGS. 2A and 2B are waveform diagrams illustrating a glitch and a notch to be removed by the present invention.

FIG. 2A illustrates the state in which a glitch occurs in a normal square wave, and FIG. 2B illustrates the state in which a notch occurs in a normal square wave.

While the analog waveforms of a glitch and a notch are different from the illustrated waveforms, by modeling the glitch and the notch into digital waveforms, the illustrated waveforms are obtained.

In the occurrence of a glitch or a notch, since an interval having a low level is formed, the mis-operation of a circuit can result.

Figure 3:
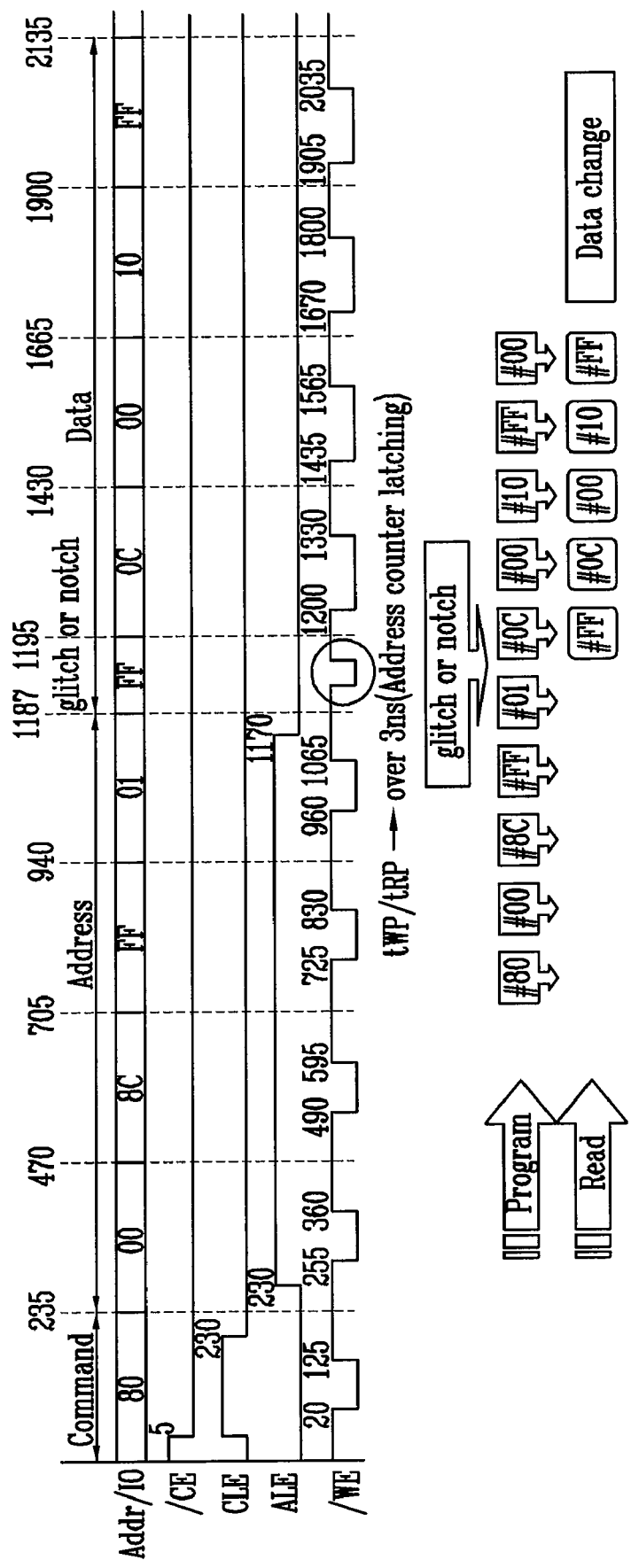
FIG. 3 is a view for explaining the influence of noise which occurs in the operation of a semiconductor device.

FIG. 3 is a view for explaining the influence of noise which occurs in the operation of a semiconductor device.

FIG. 3 illustrates various control signals and addresses which are applied to a microcontroller in the operation of a non-volatile memory device.

While a command latch enable signal 'CLE' is activated, a specific command '80' is inputted. Next, while an address latch enable signal 'ALE' is activated, specific addresses are sequentially inputted. Then, while a write enable signal '/WE' is activated, specific data are inputted in conformity with the previously inputted addresses. If a glitch or a notch occurs so that the write enable signal '/WE' is activated for a short time, undesired data 'FF' that is produced by the glitch or the notch may be stored in the non-volatile memory device through a programming operation.

That is to say, while data is programmed in the sequence of '0C', '00' '10' and 'FF', the undesired data 'FF' may be stored when the glitch or the notch occurs. If the undesired data is stored, in the operation of reading the data is stored in the memory device, as the stored undesired data is outputted, a data change results, whereby mis-operation of the memory device is caused.

Figure 4:
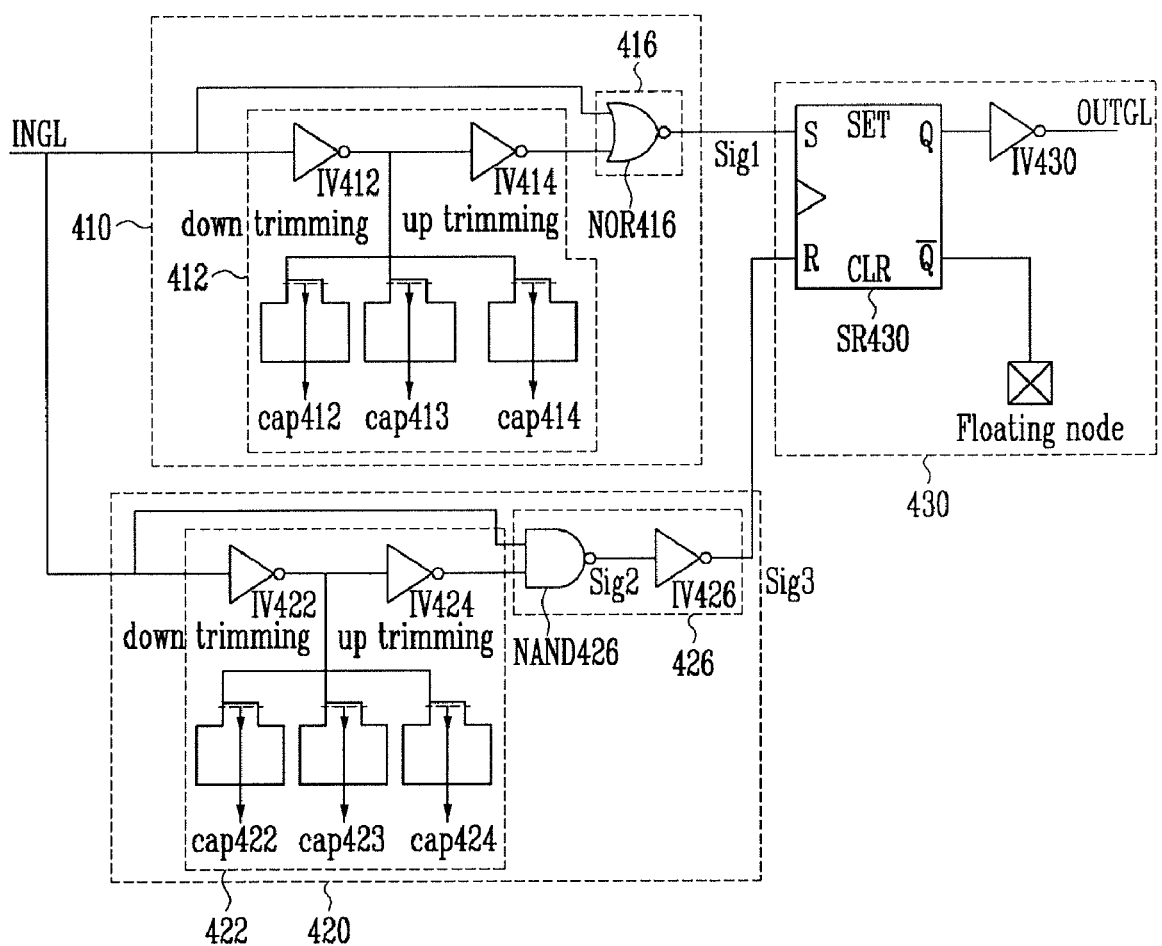
FIG. 4 is a circuit diagram illustrating a noise protector in accordance with an embodiment of the present invention.

FIG. 4 is a circuit diagram illustrating a noise protector in accordance with an embodiment of the present invention.

A noise protector 400 includes a first noise control block 410 for NORing an input signal 'INGL' and a signal obtained by trimming the input signal 'INGL' and providing an output, a second noise control block 420 for NANDing the input signal 'INGL' and a signal obtained by trimming the input signal 'INGL' and providing an output, and an output signal generation block 430 for outputting an output signal removed of noise in response to the outputs of the first noise control block 410 and the second noise control block 420.

The first noise control block 410 NORs the input signal 'INGL' and the signal obtained by trimming the input signal 'INGL' and outputs a signal which indicates when both signals are at a low level.

The first noise control block 410 includes a trimmed signal output section 412 for trimming the input signal and a first signal output section 416 for NORing the input signal and the trimmed input signal.

The trimmed signal output section 412 includes a first inverter IV412 for inverting the input signal, one or more capacitors cap412, cap413 and cap414 for trimming the inverted input signal, and a second inverter IV414 for inverting the signal trimmed by the capacitors cap412, cap413 and cap414.

The capacitors cap412, cap413 and cap414 are connected in parallel to the connection nodes of the first inverter IV412 and the second inverter IV414.

Preferably, the capacitors cap412, cap413 and cap414 are configured using NMOS transistors. By adjusting capacitance depending upon the characteristic of a glitch or a notch, the rate at which the input signal is trimmed is controlled.

In other words, in a glitch or a notch, if a low level is maintained for a short period of time, by disconnecting connected metal lines, the number of capacitors which are connected in parallel is decreased. However, in a glitch or a notch, if a low level is maintained for a relatively longer time period, by connecting disconnected metal lines, the number of capacitors which are connected in parallel is increased.

The first signal output section 416 includes a NOR gate NOR416 for NORing the input signal and the trimmed input signal. Therefore, the first signal output section 416 outputs a high level for an interval in which the input signal and the trimmed input signal simultaneously have a low level.

The operation of the first noise control block 410 will be described with reference to FIG. 5.

Figure 5:
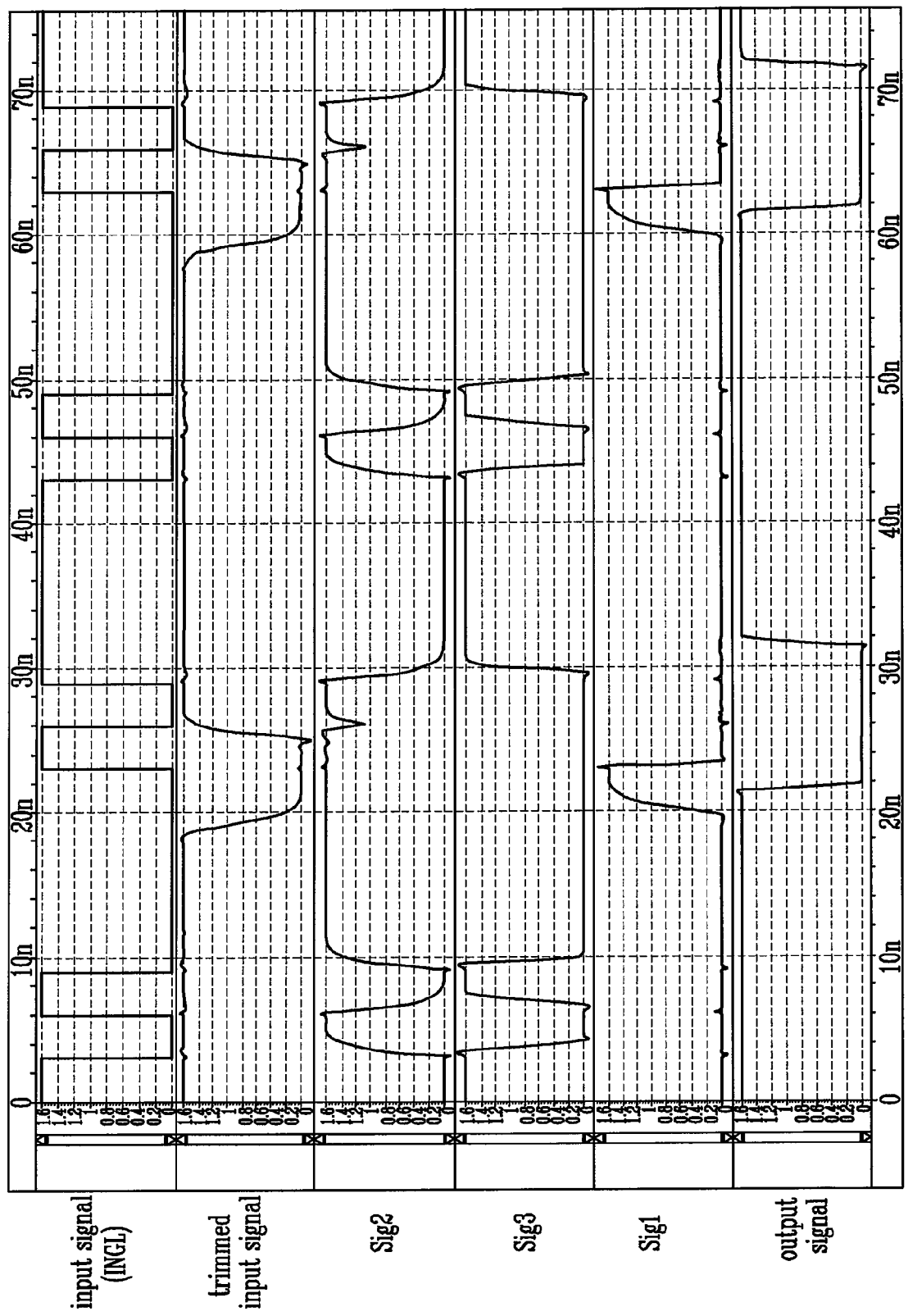
FIG. 5 is a waveform diagram illustrating waveforms which are applied in the operation of the noise protector in accordance with an embodiment of the present invention.

FIG. 5 is a waveform diagram illustrating waveforms which are applied in the operation of the noise protector in accordance with an embodiment of the present invention.

It is to be understood that glitches and notches are sequentially included in an input signal 'INGL'.

When the input signal 'INGL' passes through the trimmed signal output section 412, a trimmed signal is outputted from the capacitors. As can be readily seen from FIG. 5, as the high level portions of a waveform are delayed, low level intervals, in which glitches and notches occur, are removed. While the low level portions of the waveform, which originally exist, are maintained at low levels, the intervals thereof can be slightly shortened by the capacitors.

A first output signal 'Sig1' is outputted by the first signal output section 416. Namely, by NORing the input signal and the trimmed input signal, when both signals have a low level, the first output signal 'Sig1' having a high level is outputted.

The second noise control block 420 will be described below with reference to FIG. 4.

The second noise control block 420 NANDs the input signal 'INGL' and the signal obtained by trimming the input signal 'INGL', and outputs a signal which indicates when both signals are at a high level.

The second noise control block 420 includes a trimmed signal output section 422 for trimming the input signal and a second signal output section 426 for NANDing the input signal and the trimmed input signal.

The trimmed signal output section 422 includes a first inverter IV422 for inverting the input signal, one or more capacitors cap422, cap423 and cap424 for trimming the inverted input signal, and a second inverter IV424 for inverting the signal trimmed by the capacitors cap422, cap423 and cap424.

The respective capacitors are connected in parallel to the connection nodes of the first inverter IV422 and the second inverter IV424.

Preferably, the respective capacitors are configured using NMOS transistors. By adjusting capacitance depending upon the characteristic of a glitch or a notch, the rate at which the input signal is trimmed is controlled.

In other words, in a glitch or a notch, if a low level is maintained for a short period of time, by disconnecting connected metal lines, the number of capacitors which are connected in parallel is decreased. However, in a glitch or a notch, if a low level is maintained for a relatively long period of time, by connecting disconnected metal lines, the number of capacitors which are connected in parallel is increased.

The second signal output section 426 includes a NAND gate NAND426 for NANDing the input signal and the trimmed input signal, and an inverter IV426 for inverting the output of the NAND gate NAND426. Therefore, the second signal output section 426 outputs a high level for an interval in which the input signal and the trimmed input signal simultaneously have a high level.

The operation of the second noise control block 420 will be described with reference to FIG. 5.

FIG. 5 is a waveform diagram illustrating waveforms which are applied in the operation of the noise protector in accordance with an embodiment of the present invention.

It is to be understood that glitches and notches are sequentially included in an input signal 'INGL'.

When the input signal 'INGL' passes through the trimmed signal output section 422, a trimmed signal is outputted from the capacitors. As can be readily seen from FIG. 5, as the high level portions of a waveform are delayed, low level intervals, in which glitches and notches occur, are removed. While the low level portions of the waveform, which originally exist, are maintained as they are, the intervals thereof can be slightly shortened by the capacitors.

A NANDed signal 'Sig2' is outputted by the NAND gate NAND426 of the second signal output section 426. Thereafter, a second output signal 'Sig3' obtained by inverting the NANDed signal 'Sig2' is outputted. Namely, by NANDing the input signal and the trimmed input signal, when both signals have a high level, the second output signal 'Sig3' having a high level is outputted.

The output signal generation block 430 will be described below with reference to FIG. 4.

The output signal generation block 430 outputs a signal having a high level when both the input signal and the trimmed signal have a high level, or outputs a signal having a low level when both the input signal and the trimmed signal have a low level. In the other cases, the output signal generation block 430 outputs a signal which maintains a previous state.

The output signal generation block 430 includes an SR latch SR430 which receives the first output signal transmitted from the first noise control block 410 through the set terminal SET thereof and the second output signal transmitted from the second noise control block 420 through the reset terminal RESET thereof, and an inverter IV430 for inverting the first output Q of the SR latch SR430.

Figures 6A, 6B:
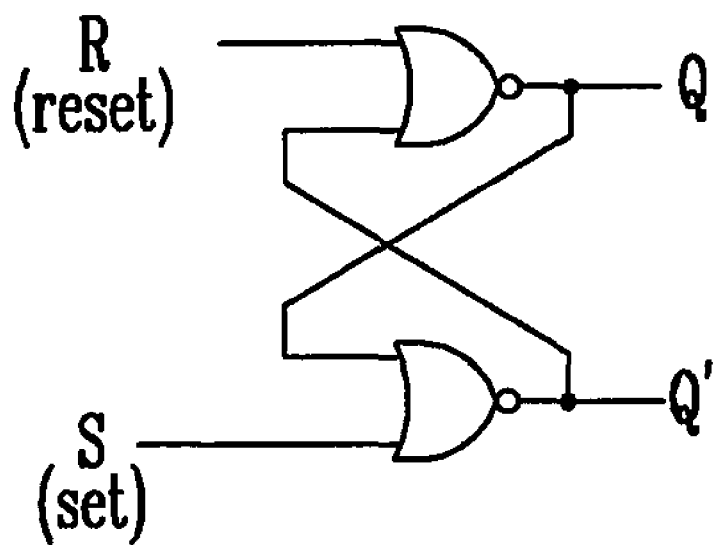
FIG. 6A is a circuit diagram illustrating the detailed configuration of an SR latch used in the present invention.
FIG. 6B is a truth table illustrating the operation of the SR latch.

FIG. 6A is a circuit diagram illustrating the detailed configuration of the SR latch, and FIG. 6B is a truth table illustrating the operation of the SR latch.

The output signal 'OUTGL' of the output signal generation unit 430 will be described with reference to FIG. 5.

When the set signal 'Sig1' has a low level and the reset signal 'Sig3' has a high level, since the first output has a low level, the output signal has a high level.

Even though the reset signal 'Sig3' changes to a low level and then returns to a high level, the output signal maintains the same level.

If the set signal 'Sig1' changes to a high level, the output signal changes to a low level. Even though the set signal 'Sig1' returns to a low level, the output signal maintains the same low level.

Thereafter, if a reset signal 'Sig3' having a high level is outputted, the value of the output signal returns to a high level.

As a result, when both the input signal and the trimmed input signal have a high level, an output signal 'OUTGL' having a high level is outputted, and when both the input signal and the trimmed input signal have a low level, an output signal 'OUTGL' having a low level is outputted.

By the configuration described above, a pulse waveform removed of glitches and notches can be generated.

Figure 7:
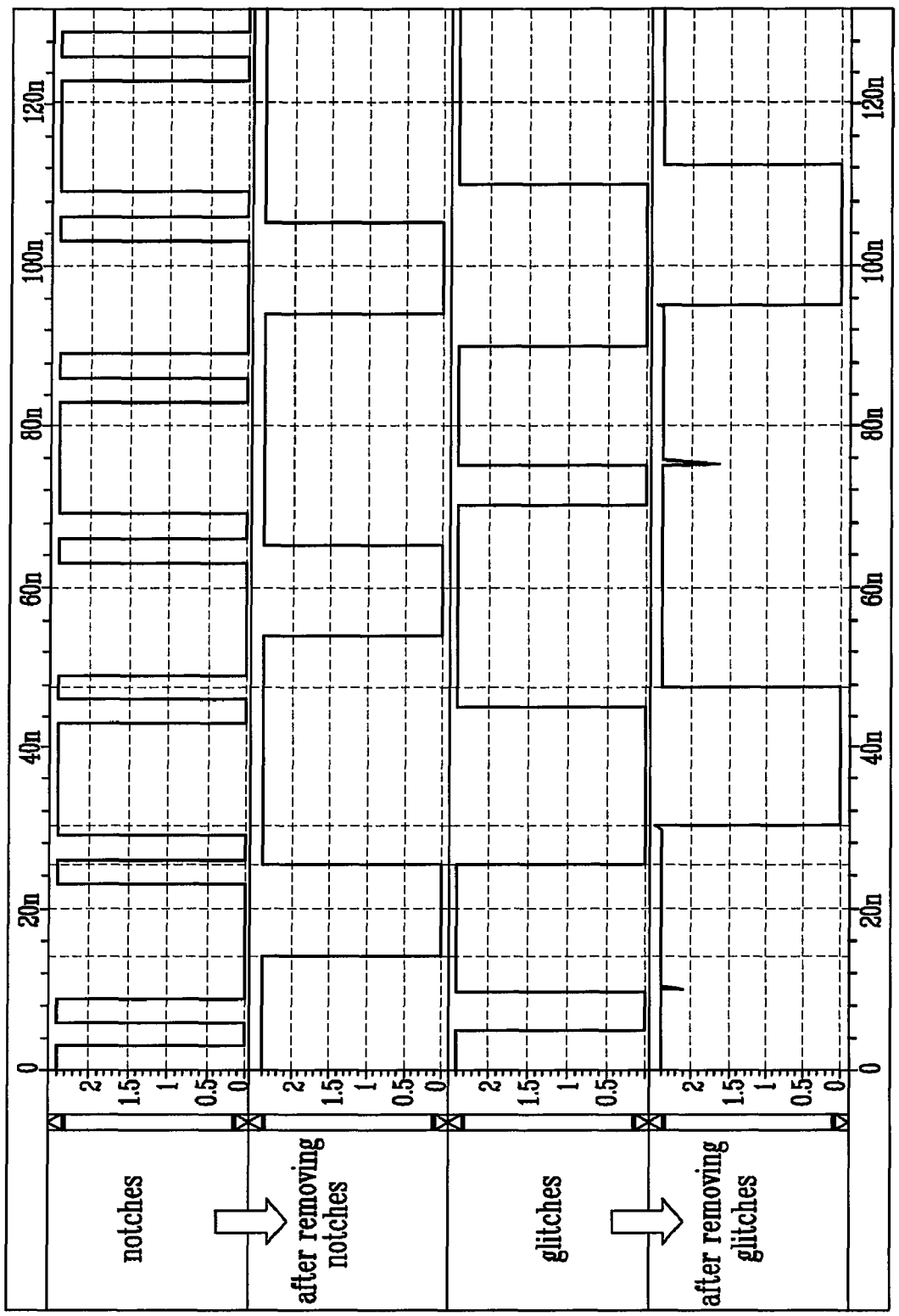
FIG. 7 is a waveform diagram illustrating notch and glitch removing operations in accordance with an embodiment of the present invention.

FIG. 7 is a waveform diagram illustrating notch and glitch removing operations in accordance with an embodiment of the present invention.

In the case that notches are continuously generated in an input signal, due to the presence of the noise protector according to the present invention, a square wave which is removed of notches can be outputted. In this regard, an interval for which a low level is applied becomes slightly shorter than the input signal.

Similarly, in the case that glitches are continuously generated in an input signal, due to the presence of the noise protector according to the present invention, a square wave which is removed of glitches can be outputted. In this regard, an interval for which a low level is applied becomes slightly shorter than the input signal.

FIG. 8 is a waveform diagram illustrating notch and glitch removing operations under a voltage condition which is different from FIG. 7.

In this case, while glitches or notches can be removed in the same manner, the degree to which a low level application interval is shortened is different from the case of FIG. 7.

FIG. 9 shows tables illustrating margins under various voltage and temperature conditions in an embodiment of the present invention.

It can be understood that, when external voltages are 3V and 1.8V, depending upon whether input noise is a glitch or a notch, margins after the removal of noise become different.

The noise protector according to the present invention, configured as described above, provides advantages in that, when noise such as glitches or notches is generated, the noise can be removed by a circuit for trimming the noise.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:
1. A noise protector comprising:
a first noise control block for NORing an input signal and a first trimmed input signal and providing a first output;
a second noise control block for NANDing the input signal and a second trimmed input signal and providing a second output; and
an output signal generation block for outputting an output signal removed of noise in response to the first output and the second output,
wherein the first noise control block includes a first trimmed signal output section for trimming the input signal, and a first signal output section for NORing the input signal and the first trimmed input signal,
wherein the first trimmed signal output section includes first and second inverters connected in series at a first connection node, and one or more first capacitors connected in parallel at the first connection node, and
wherein the output signal generation block includes an SR latch which receives the first output as a set signal and the second output as a reset signal.
2. The noise protector according to claim 1, wherein the first trimmed signal output section increases or decreases a delay time of the input signal depending upon whether the number of the first capacitors increases or decreases.
3. The noise protector according to claim 1, wherein the first trimmed signal output section increases or decreases a delay time of the input signal depending upon whether the number of the first capacitors increases or decreases.
4. The noise protector according to claim 1, wherein the second noise control block includes a second trimmed signal output section for trimming the input signal, and a second signal output section for NANDing the input signal and the second trimmed input signal.
5. The noise protector according to claim 4, wherein the second trimmed signal output section includes a third inverter for inverting the input signal, one or more second capacitors for trimming the inverted input signal, and a fourth inverter for inverting the signal trimmed by the second capacitors.
6. The noise protector according to claim 5, wherein the second trimmed signal output section increases or decreases a delay time of the input signal depending upon whether the number of the second capacitors increases or decreases.
7. The noise protector according to claim 4, wherein the second trimmed signal output section includes third and fourth inverters connected in series at a connection node, and one or more second capacitors connected in parallel at the connection node.
8. The noise protector according to claim 7, wherein the second trimmed signal output section increases or decreases a delay time of the input signal depending upon whether the number of the second capacitors increases or decreases.
9. A noise protector comprising:
a first noise control block for outputting information regarding whether both an input signal and a first trimmed input signal have a low level;
a second noise control block for outputting information regarding whether both the input signal and a second trimmed input signal have a high level; and an output signal generation block for outputting an output signal removed of noise in response to outputs of the first noise control block and the second noise control block, wherein the first noise control block includes a first trimmed signal output section for trimming the input signal, and a first signal output section for NORing the input signal and the first trimmed input signal, wherein the first trimmed signal output section includes first and second inverters connected in series at a connection node, and one or more capacitors connected in parallel at the connection node, and wherein the output signal generation block includes an SR latch which receives the output of the first noise control block as a set signal and the output of the second noise control block as a reset signal.

10. The noise protector according to claim 9, wherein the first noise control block outputs a signal having a high level when both the input signal and the first trimmed input signal have a low level.

11. The noise protector according to claim 9, wherein the second noise control block outputs a signal having a high level when both the input signal and the second trimmed input signal have a high level.

12. The noise protector according to claim 9, wherein the second noise control block includes a second trimmed signal output section for trimming the input signal, and a second signal output section for NANDing the input signal and the second trimmed input signal.

* * * * *